United States Patent
Osinski et al.

(10) Patent No.: US 6,421,363 B1
(45) Date of Patent: Jul. 16, 2002

(54) SEMICONDUCTOR LASERS AND AMPLIFIERS WITH GRATING-INDUCED ANISOTROPIC WAVEGUIDE

(76) Inventors: Marek A. Osinski, 1017 Madison St. NE, Albuquerque, NM (US) 87110; Alexander P. Bogatov, 14 Ordzhonikidze 6, Moscow (RU), 117071; William E. Thompson, 1515 Gray Rock Pl. NE., Abuquerque, NM (US) 87112

( * ) Notice: Subject to any disclaimer, the term of this patent is extended or adjusted under 35 U.S.C. 154(b) by 0 days.

(21) Appl. No.: 09/270,737

(22) Filed: Mar. 16, 1999

Related U.S. Application Data
(60) Provisional application No. 60/078,208, filed on Mar. 17, 1998.

(51) Int. Cl.[7] .............................. H01S 5/00; H01S 3/08; H01S 3/00
(52) U.S. Cl. ........................ 372/50; 372/102; 359/344
(58) Field of Search .......................... 372/20, 45, 102, 372/50, 96, 92; 359/344

(56) References Cited

U.S. PATENT DOCUMENTS

| | | | |
|---|---|---|---|
| 5,065,406 A | * 11/1991 | Kinoshita ..................... | 372/96 |
| 5,103,456 A | 4/1992 | Scifres et al. .................. | 372/50 |
| 5,337,328 A | 8/1994 | Lang et al. ..................... | 372/45 |
| 6,122,299 A | * 9/2000 | DeMars et al. ................ | 372/20 |

* cited by examiner

Primary Examiner—Quyen Leung
(74) Attorney, Agent, or Firm—Jagtiani + Guttag

(57) ABSTRACT

The present invention provides a coherent light-generating semiconductor structure comprising: at least one active region including a pumped portion for achieving optical gain; a first optical waveguide for confining light waves in the transverse direction and for propagating light waves along the optical axis of said first optical waveguide; first and second reflective means, the first and second reflective means being spaced apart from one another and defining a resonant optical cavity therebetween, the pumped portion of the at least one active region being located at least partially within the resonant optical cavity, and the resonant optical cavity encompassing at least a portion of the optical waveguide; the active region, the optical waveguide, and the resonant optical cavity having properties necessary to establish and maintain a principal optical mode; a grating located in at least a portion of the resonant optical cavity, the grating having grating teeth oriented at an angle relative to the first and second reflective means, such that substantially all excited light waves which are incident on the first and second reflective means are out of the Bragg resonance bandwidth of the grating. The present invention also provides a method for reducing filamentation in a high-power laser or amplifier.

25 Claims, 10 Drawing Sheets

SEMICONDUCTOR LASERS AND AMPLIFIERS WITH GRATING-INDUCED ANISOTROPIC WAVEGUIDE

RELATED APPLICATION

The present application is based on U.S. Provisional Patent Application No. 60/078,208 filed Mar. 17, 1998, the entire disclosure and contents of which are hereby incorporated by reference.

BACKGROUND OF THE INVENTION

1. Field of the Invention

The present invention pertains to the field of high-power semiconductor lasers, laser arrays, and amplifiers.

2. Description of the Prior Art

Broad area semiconductor lasers contain a laterally-extended gain region within the resonant optical cavity of the laser. Because broad area lasers have larger gain volumes than conventional narrow waveguide, single spatial mode semiconductor lasers, these lasers are capable of achieving higher output power. However, as a rule, if the lateral width of the active region in a broad area laser is greater than about 5 $\mu$m, the optical resonant cavity of the laser is capable of supporting multiple spatial modes. The lateral boundary conditions for the electromagnetic wave, which play the dominant role in selecting a single spatial mode in narrow waveguide lasers, do not play a significant role in mode selection for broad area lasers. Additionally, when the lateral width of the active region is greater than about 50 $\mu$m, the relative gain thresholds of different spatial modes are very close to one another. As a result, a number of lateral spatial modes (typically in the 10s) are simultaneously excited in broad area lasers with a lateral dimension of greater than about 50 $\mu$m, even at moderate pumping levels. The number of excited lateral spatial modes increases as the pumping level increases, so that the output optical power in an individual lateral mode tends to saturate or doesn't increase at all.

In broad area semiconductor lasers, the lateral spatial distribution of laser energy is further complicated by an optical nonlinearity in the semiconductor laser gain region, due to the dependence of the refractive index on the free-charge carrier density. This nonlinearity is responsible for the self-deformation of the lateral mode field distribution, so that the lateral extent of the active region can have areas of higher and lower light intensity, often called filaments. The physical reason for the appearance of filaments can be understood as follows: Suppose light intensity increases slightly in a small part of the active region, for example due to an intensity fluctuation or a slight inhomogeneity in the epitaxial structure of the semiconductor laser. In this region, the local carrier density will be decreased below that in nearby ambient areas, due to the higher rate of stimulated recombination. The decreased carrier density in this local area causes a corresponding increase in the refractive index. As a result of this local increase in the refractive index, light rays will be deflected into the local area from adjacent parts of the active region, further increasing the optical intensity. This reinforces the original effect and an instability in the homogeneous lateral distribution of the optical intensity appears, leading to the creation of filaments.

An important feature of filamentation in broad area semiconductor lasers is the periodicity of the filaments, with an observed spacing between nearest filaments typically in the range of 10–20 $\mu$m in the lateral direction. This observed periodicity can be described in a series of spatial Fourier harmonics. In these terms, one can consider the appearance of filamentation in a broad area laser as the appearance of perturbed waves, where each wave represents a separate Fourier harmonic. The actual spatial period of the filamentation is determined by the phase matching conditions between the main laser mode, which propagates parallel to the optical cavity axis, and the perturbed waves, which propagate at some angle with respect to the axis. Thus, there are two physical features that are responsible for the appearance and behavior of intensity filamentation in broad area semiconductor lasers. The first is the optical nonlinearity of the semiconductor gain media due to the dependence of the refractive index on carrier density, and the second is the phase matching condition for waves which are affected by the nonlinear interaction.

The phase matching requirement is a common condition in almost all optical nonlinear processes such as, for example, the generation of optical mixing frequencies, stimulated Brillouin scattering, and stimulated Raman scattering. These processes can take place in many different media in which a nonlinear effect can be achieved, not only semiconductor gain media, but also transparent media such as dielectric crystals, gases, etc.

As indicated above, the existence of many excited lateral modes in broad area semiconductor lasers and the tendency for intensity filamentation lead to the generation of a very complex and nonuniform lateral intensity distribution. This is an undesirable property of conventional broad area semiconductor lasers mainly due to two effects. The first is the decrease in the reliability, or lifetime, of the operating laser. In the localized area of the laser cavity mirror (often a facet of the semiconductor laser diode structure) which corresponds to the center of a filament, the light intensity can greatly exceed the average light intensity along the lateral direction of the laser mirror. As the average optical intensity increases with increased pumping, these local areas will reach the threshold for optical damage much sooner than would be indicated by the average optical intensity alone, leading to premature failure when these lasers are operated to emit high output power.

The second effect is the large divergence of the output optical beam from a conventional broad area semiconductor laser. As indicated above, the existence of filamentation can be described as the excitation of selected perturbing waves. Thus, under these conditions, the optical output beam contains both the primary laser mode, which propagates in the optical cavity axis direction, and perturbing waves which propagate at an angle with respect to the optical cavity axis. As total laser power is increased by increasing the pumping of the broad area semiconductor laser, a greater proportion of the laser power appears in the perturbing waves and the output laser beam becomes increasingly divergent. This increased divergence may exceed the diffraction-limited divergence by a large amount, a actor of 10 or more. The combination of reduced reliability and increased output laser beam divergence makes conventional broad area lasers unsuitable for many applications.

There are some broad area semiconductor lasers which contain a grating within the waveguide layers. The grating is tuned so as to be in Bragg resonance at a certain wavelength within the gain bandwidth of the laser. Thus the grating is used as a filter tuned to select a single lasing wavelength or a single spatial mode. In other words, the grating is designed to increase the threshold gain for a number of spectral or spatial modes relative to the single mode for which the grating is in resonance.

U.S. Pat. No. 5,103,456 to Scifres et al., the entire disclosure and contents of which is hereby incorporated by reference, describes an integrated semiconductor master oscillator-power amplifier (MOPA) having a broad area gain region. For optical coupling between the oscillator and the amplifier, the patent describes the use of an angled grating reflector. The orientation angle and grating period are chosen to produce efficient Bragg diffraction to deflect the output oscillator laser beam in the direction of the amplifier optical axis, thereby minimizing the feedback from the amplifier into the oscillator.

U.S. Pat. No. 5,337,328 to Lang et al., the entire disclosure and contents of which is hereby incorporated by reference, describes a broad area semiconductor laser which includes a grating reflector oriented at an angle with respect to the optical resonant cavity mirrors. The grating period and orientation are chosen such that the wavelength and propagation direction of the light beam which satisfies the Bragg resonance condition over the total area inside the laser cavity will impinge at normal incidence to the optical cavity mirrors. The light beam completing a round trip through the optical resonant cavity takes a serpentine path due to Bragg reflections from the grating. Other light beams, which do not satisfy the Bragg resonance conditions because of a difference in wavelength or propagation direction, will incur additional optical losses and will have a correspondingly lower Q factor. The grating in this laser thus operates as a spectral and spatial filter. In so doing, Lang et al. attempt to create a semiconductor laser design that will suppress those laser beams which cause filamentation and thereby achieve single spatial and longitudinal mode operation.

SUMMARY OF THE INVENTION

It is an object of the present invention to provide broad area semiconductor lasers and amplifiers that can discriminate against filamentation in the lateral direction by introducing a lateral optical anisotropy in the active region of the laser.

It is further an object of this invention to provide a broad area semiconductor laser that is able to reduce the distortion of the planar wavefront of the output laser beam. This wavefront distortion may exist inside the laser cavity due to imperfect laser structure fabrication leading to inhomogeneities, temperature gradients during laser operation, current spreading, etc. In other words, it is an object of the present invention to incorporate a means for self-correction of the laser beam distortions that tend to become evident with increasing output power due to non-linear wave interactions. The end goal is to obtain a high efficiency, high power, broad area semiconductor laser with diffraction limited divergence of the output laser beam.

In a first aspect, the present invention provides a coherent light-generating semiconductor structure comprising: at least one first active region including a first pumped portion for achieving optical gain; a first optical waveguide for confining light waves in the transverse direction and for propagating light waves along the optical axis of said first optical waveguide; first and second reflective means, the first and second reflective means being spaced apart from one another and defining a first resonant optical cavity therebetween, the first pumped portion of the at least one first active region being located at least partially within the first resonant optical cavity, and the first resonant optical cavity encompassing at least a portion of the first optical waveguide; the first active region, the first optical waveguide, and the first resonant optical cavity having properties necessary to establish and maintain a first principal optical mode; a first grating located in at least a portion of the first resonant optical cavity, the first grating having first grating teeth oriented at an angle relative to the first and second reflective means, such that substantially all excited light waves which are incident on the first and second reflective means are out of the Bragg resonance bandwidth of the first grating.

In a second aspect, the present invention provides a method for reducing filamentation in a high-power laser or amplifier comprising the steps of: generating a laser beam; and transmitting the laser beam through a resonant optical cavity defined by two reflective means spaced apart from one another and having a grating located therein, the grating having grating teeth oriented at an angle relative to the first and second reflective means such that substantially all excited light waves that become incident on the reflective means are out of the Bragg resonance bandwidth of the grating.

BRIEF DESCRIPTION OF THE DRAWINGS

The invention will be described in conjunction with the accompanying drawings, in which.

DETAILED DESCRIPTION OF THE PREFERRED EMBODIMENT

Definitions

Figure 1:
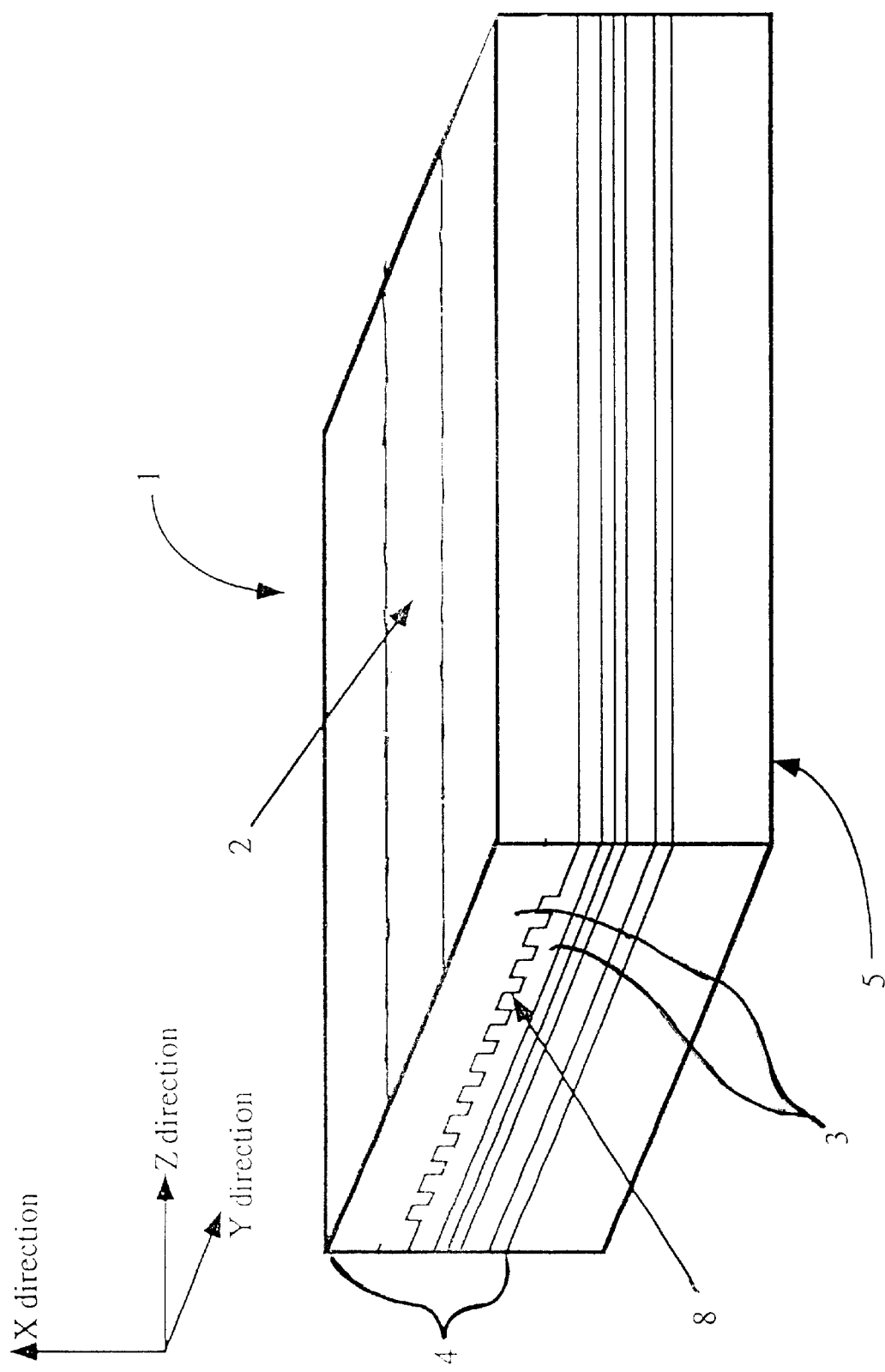
FIG. 1 is a perspective view of the broad area semiconductor laser of the present invention having induced optical anisotropy in the lateral direction of the waveguide due to a grating tilted at an angle with respect to the optical cavity axis.

For the purposes of the present invention, the term "grating" refers to a portion of semiconductor laser or amplifier structure in which there is a periodic variation of the complex effective refractive index in the lateral direction. The angled grating of the present invention is aligned at an angle with respect to the optical axis of the resonant optical cavity. The grating may be formed between two adjacent layers of differing refractive indices, through a periodic variation of the thickness of each layer in a mutually anticorrelated way, such that the total thickness of both layers is constant. The grating may also be formed via a periodic variation in the composition of one or a few layers in a stack of layers, so that a periodic variation in the refractive index is produced. This method of obtaining a spatial variation of the effective refractive index is similar to the implementation of gratings in well-known distributed feedback (DFB) or distributed Bragg reflection (DBR) semiconductor lasers. Additionally, however, other methods of obtaining spatial modulation of the effective refractive index can also be used, such as by variations in doping of one or a few layers, in optical gain, in optical losses, etc.

For the purposes of the present invention, the term "grating teeth" refers to lateral contours of equal complex effective refractive indices. In the drawing figures, for simplicity, grating teeth are shown schematically as sets of parallel lines perpendicular to grating axis.

For the purposes of the present invention, the term "pumped portion" of an active region may refer to an entire active region being pumped.

For the purposes of the present invention, the term "laser" may also refer in some circumstances to an amplifier as well.

Description

The present invention provides a broad area semiconductor laser or amplifier including a waveguide having induced optical anisotropy in the lateral direction due to the incorporation of a grating tilted at an angle with respect to the principal optical mode propagation axis. The grating tilt angle and period are chosen such that any wavelength within the optical gain bandwidth will be out of Bragg resonance with the grating. Due to detuning from Bragg resonance conditions, the effect of the grating is to introduce a phase shift in the optical mode beam as it propagates in the semiconductor laser or amplifier waveguide, with the phase shift value depending on the extent of detuning from the Bragg resonance condition. The amount of detuning from the Bragg resonance condition is in turn dependent on the exact direction of propagation of each optical mode supported by the optical cavity relative to the angle of the grating.

There are two physical features that are responsible for the appearance of intensity filamentation in broad area semiconductor lasers or amplifiers: refractive index dependence on carrier density, and phase matching conditions for round-trip propagation inside the optical resonant cavity. The present invention is based on a concept of discriminating against the creation of intensity filamentation by providing conditions inside the optical waveguide such that phase matching conditions cannot be fulfilled for those light beams that contribute to the formation of filamentation. These optical waveguide conditions are achieved by incorporating a grating tilted with respect to the optical cavity axis. The grating period and orientation are chosen so that Bragg resonance conditions are not met for any of the light beams that propagate in the optical waveguide. However, the presence of the grating does introduce an additional phase shift in all light beams in the optical waveguide. Under operating conditions, the principal optical mode in the optical resonant cavity, propagating along the cavity axis, establishes a resonance condition which accommodates the phase shift for that mode's propagation direction. Other optical modes, which propagate at a slight angle with respect to the optical cavity axis, incur a phase shift due to interaction with the grating that is different because of the different angle of propagation. This additional phase shift disrupts the phase matching conditions for round-trip propagation inside the optical resonant cavity, thus discriminating against the excitation of those optical modes that contribute to the lateral intensity filamentation.

Broad area semiconductor lasers of the present invention include a pumped active region, including one or multiple layers, which provides the optical gain necessary to generate the laser; waveguiding layers to control the propagation characteristics of the light waves; and reflectors to provide optical feedback and establish the resonant optical cavity. For a semiconductor laser diode, the pumped active region can be defined by a conductive contact area on the surface of the laser structure that generally coincides with the expected or desired light intensity envelope for the light waves propagating within the laser cavity. Generally, the contact area is a straight stripe that is tilted with respect to the normal to the laser reflectors, although in some cases the contact area may be aligned perpendicular to the laser reflectors. Branched or multiple contacts for non-uniform pump current distribution are also possible.

The transverse waveguide structure of the present invention, formed by the active and waveguiding layers in the direction normal to the substrate plane, is such that it is preferably capable of supporting propagation of only a single transverse spatial mode. In the lateral direction, a lateral index guiding or gain guiding is possible. One or a few layers of the transverse waveguiding structure can have a periodically modulated thickness in a manner that forms the grating. The grating may be formed also by lateral periodic changes in atomic composition or a number of other methods. What is particularly important about the grating is that it provides a periodic variation of the effective complex refractive index for light waves propagating in the waveguide. The lateral area of the grating may be extended over all the pumped region, may overlap only with a particular pumping area, or may be rendered in several parts so that some areas of the pumped region do not contain the grating.

The teeth of the grating of the present invention, defined as lines of equal value for the complex refractive index, must be tilted at a non-zero angle with respect to the laser cavity axis. It is preferable that the tilt angle be smaller than 15 degrees, although larger angles are possible. Amplitude modulation of the refractive index, the period of modulation, and the tilt angle are such that the Bragg resonance condition is not fulfilled, and no total intensity diffraction of light waves occurs along the full extent of their propagation in the active region. However, even though Bragg resonance conditions are not fulfilled, some small part of the intensity of the light waves will still be diffracted, and first-order coupled diffractive waves will appear at low intensity levels. The efficiency of this diffraction into the first order will depend on the amount of detuning from the Bragg condition. The intensity of the first-order diffractive waves will oscillate between a small maximum value and zero as the light beam propagates along the optical axis. At the same time, the intensity of the principal light waves excited in the active region will oscillate as well, but in an anticorrelated manner. In this way, light waves excited in the active region will be coupled with the first-order diffracted waves, and they will exchange intensity with each other. This behavior introduces an additional phase shift in the principal light waves excited by the active region as they propagate through the areas of the active region that contain the grating.

The magnitude of the additional phase shift induced by the presence of the grating depends on the grating parameters and also on the angle between the direction of propagation of the light waves in the active region and the direction of the grating teeth. In other words, the length of the light wave's wave vector depends not only on its optical frequency and average effective refractive index but also on the direction of the light wave's propagation relative to the grating teeth.

In cases where lateral filamentation is evident in broad area semiconductor lasers or amplifiers, the lateral intensity distribution can be considered to be the result of the appearance of perturbing waves which propagate at some angle with respect to the optical axis and, consequently, with respect to the principal light wave excited in the active region. Due to the difference in the angle of propagation, the perturbation waves receive a different additional phase shift (or, alternatively, a different wave vector length) than the principal light wave. This additional phase shift acts to break the phase matching condition which otherwise would have to be satisfied for excitation of the perturbation waves. When that phase matching condition is broken, the propagation of the perturbation waves in the optical cavity is no longer possible.

In one embodiment of the present invention, broad area semiconductor lasers or amplifiers can be made significantly less likely to exhibit lateral intensity filamentation, particularly as pumping level and hence the optical output power is increased. These devices can thus be a source of high power coherent beams with nearly diffraction-limited divergence.

In another embodiment, the present invention provides a broad area semiconductor laser that operates in a single longitudinal mode, due to optical losses induced by the grating which are a function of wavelength. With the wavelength discrimination provided by the grating, it is also possible to select a specific longitudinal mode (and hence a specific lasing wavelength) by controlling the average refractive index in the optical cavity. This can be achieved, for example, by changing pumping intensity, semiconductor laser device temperature, or other means that are well known in the state of the art.

In another embodiment, the present invention provides a high-power broad area surface emitting semiconductor laser in the single-spatial and single-frequency regime of the operation. This can be achieved, for example, by using a leaky-wave waveguide containing the active layer and a tilted grating situated on the substrate of the laser structure.

Yet another embodiment of the present invention provides broad area semiconductor lasers that are arranged in an array. Coherence among individual lasers is achieved by using a small amount of light wave intensity in the first-order Bragg diffraction for optical coupling, with the goal to produce a higher power coherent output laser beam.

With reference to FIG. 1, a perspective view is shown of a broad area semiconductor laser or amplifier structure 1 constructed according to the present invention. The structure 1 includes a substrate 5, a stack of semiconductor layers 4 that includes a p-n junction and layers 3 that form an angled grating 8. As in other semiconductor lasers or amplifiers, the structure of FIG. 1 has electrical contacts: a contact (not shown) on the bottom surface of the substrate 5 and another contact 2 on the top surface of the structure 1. The top contact 2 of the laser or amplifier of the present invention can be formed in various geometries, covering all of the top surface or one or more portions of the top surface. In the embodiment shown in FIG. 1, the contact 2 only covers a portion of the top surface of the structure 1 and defines the pumped active region 6 shown in FIG. 2. A forward electrical bias applied to the contacts pumps the active region 6 by creating electron-hole pairs in one or multiple layers of the stack 4 near the p-n junction. In the semiconductor laser embodiment of the present invention, the active region 6 generates coherent light at pumping current levels higher than a lasing threshold current. In alternative embodiments of the present invention, the active region may lack a p-n junction and be pumped, for example, by a unipolar tunneling carrier mechanism in so-called quantum-cascade lasers or by an optical mechanism in optically-pumped semiconductor lasers, both of which are well known in the state of the art.

Light waves generated by the active region propagate in an optical waveguide formed in the transverse direction (the X direction in FIG. 1) by the stack of layers 4. The optical properties of the waveguide are typically chosen so that the waveguide will support only a single optical mode in the transverse direction. The effective refractive index for this optical mode depends on the refractive index and thickness of each layer included in the stack 4. As is well known, this waveguide may take the form of a homostructure, single heterostructure, double heterostructure, or a multilayer structure with separate confinement for light waves and charge carriers. The active region in the stack of layers 4 may take the form of a single layer, a single quantum-well layer, a multiple quantum well structure, or structures incorporating quantum wires or quantum dots. The quantum confined structures (quantum wells, quantum wires, quantum dots, fractional superlattices, etc.) may further be strained-layer structures or strained-compensated structures. The material of the layers for the active region and the other layers in stack 4 is typically some combination of III–V compound semiconductors, such as GaAs/AlGaAs, InP/InGaAsP, InP/InAlGaAs, InP/InAlAsSb, InGaN/AlGaN, etc., although other semiconductor or organic materials may also be used.

Each of the semiconductor laser or amplifier devices of the present invention also has a grating such as the grating 8 of FIG. 1. Since the grating in the present invention is aligned at an angle with respect to the optical axis of the laser, the presence of the grating induces a periodic spatial variation in the effective refractive index of the waveguide in the lateral direction (the Y direction in FIG. 1). The grating may be formed between two adjacent layers of differing refractive indices, due to periodic variation of the thickness of each layer in a mutually anticorrelated way such that the total thickness of both layers is constant. The grating in some embodiments of the present invention may also be formed due to a periodic variation in the composition of one or a few layers in stack 4, so that a periodic variation in the effective refractive index is produced. This method of obtaining a spatial variation of the effective refractive index is similar to the implementation of gratings in well-known distributed feedback (DFB) or distributed Bragg reflection (DBR) semiconductor lasers. Additionally, however, other methods of obtaining spatial modulation of the effective refractive index may be used, such as utilizing variations in doping of one or a few layers, in optical gain, in optical losses, etc.

Figure 2:
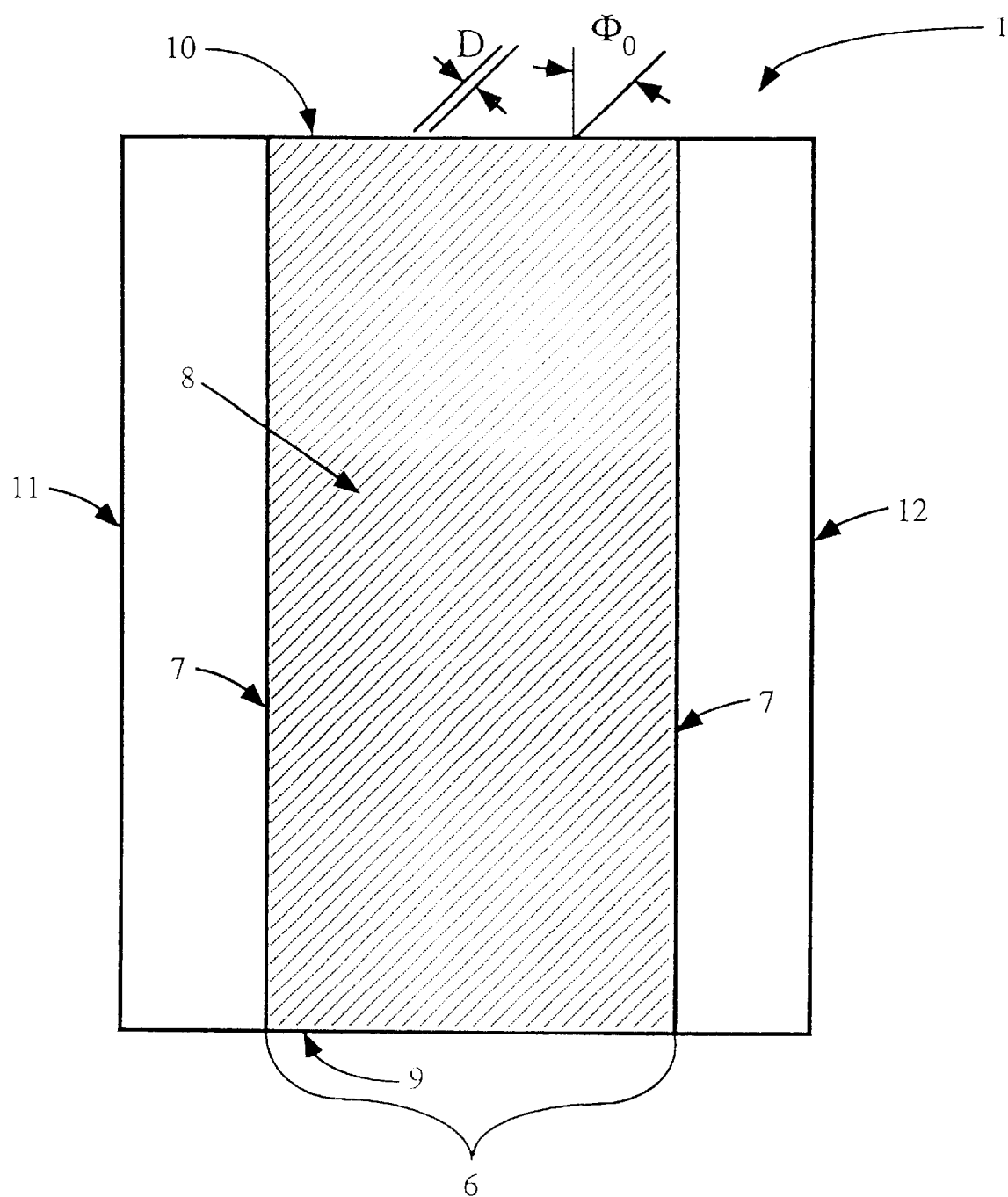
FIG. 2 is a schematic top plan view of the broad area semiconductor laser of FIG. 1, showing the structural features of the laser projected onto a single plane.

In FIG. 2, a schematic top plan view of the semiconductor laser 1 of FIG. 1 is shown, with the entire structure projected onto a single plane. A broad area pumped region 6 is defined by electrical contact boundaries 7. The angled grating 8 is shown by lines corresponding to contours of equal effective refractive index. In the following description, these lines are called grating teeth. In general, the pumped active region 6 comprises one or more layers located beneath the layer or layers containing the grating 8. The pumped region 6 has a reflective surface, end or facet 9 at one end which is a planar facet cleaved along a crystal plane in the epitaxial semiconductor material, or formed by other methods well known in the art. Facet 9 and the similar facet 10 at the other end also form the optically reflective surfaces that establish the optical resonant cavity for the laser. The reflectivity of facets 9 and 10 can be simply determined by the refractive index change due to the transition from the semiconductor material to the external environment or can be specifically tailored to achieve desired reflective or anti-reflective properties by the deposition of optical coatings, the addition of another material with a different index of refraction, or even by the use of external optical elements. All of these techniques and combinations thereof for the creation of an optical resonant cavity are well known in the art.

In FIG. 2, the distances between the electrical contact boundaries 7 and the side walls 11 and 12 are large enough to introduce sufficient light absorption in the unpumped region to prevent the formation of a parasitic optical cavity between the walls 11 and 12. Also, it is preferable to use anti-reflection coatings on walls 11 and 12 or to treat these surfaces in some other way to reduce the efficiency of these surfaces for reflection. In the embodiment of FIG. 2, the light in the optical mode defined by the optical cavity is coupled out from either or both of the reflective ends 9 and 10. The optical axis and thus the direction of propagation for the principal optical mode in the optical resonant cavity is perpendicular to the reflective ends 9 and 10. Generally, it is preferable to use a highly-reflective coating for one end so that essentially all of the laser light is coupled out of the other end.

As shown in FIG. 2, the grating teeth are tilted with respect to the optical axis by the angle $\Phi_0$, and the grating tooth spacing is equal to D. In the following discussion, only positive values of $\Phi_0$ are considered. For all embodiments of the present invention, unlike prior semiconductor structures such as those described in U.S. Pat. No. 5,337,328 to Lang et al., the angle $\Phi_0$ and the value D are chosen such that the Bragg resonance condition is not satisfied for any light wave which is incident on at least one of the reflective ends 9 or 10 and which has any wavelength $\lambda$ supported within the gain bandwidth of the active region. It is preferable that the following inequality is satisfied:

$$\sin \Phi_0 < \lambda/(2nD)$$

where n is the average effective refractive index of the waveguide. In the preferred embodiment of the present invention, the angle $\Phi_0$ is smaller than 15 degrees.

Figure 3:
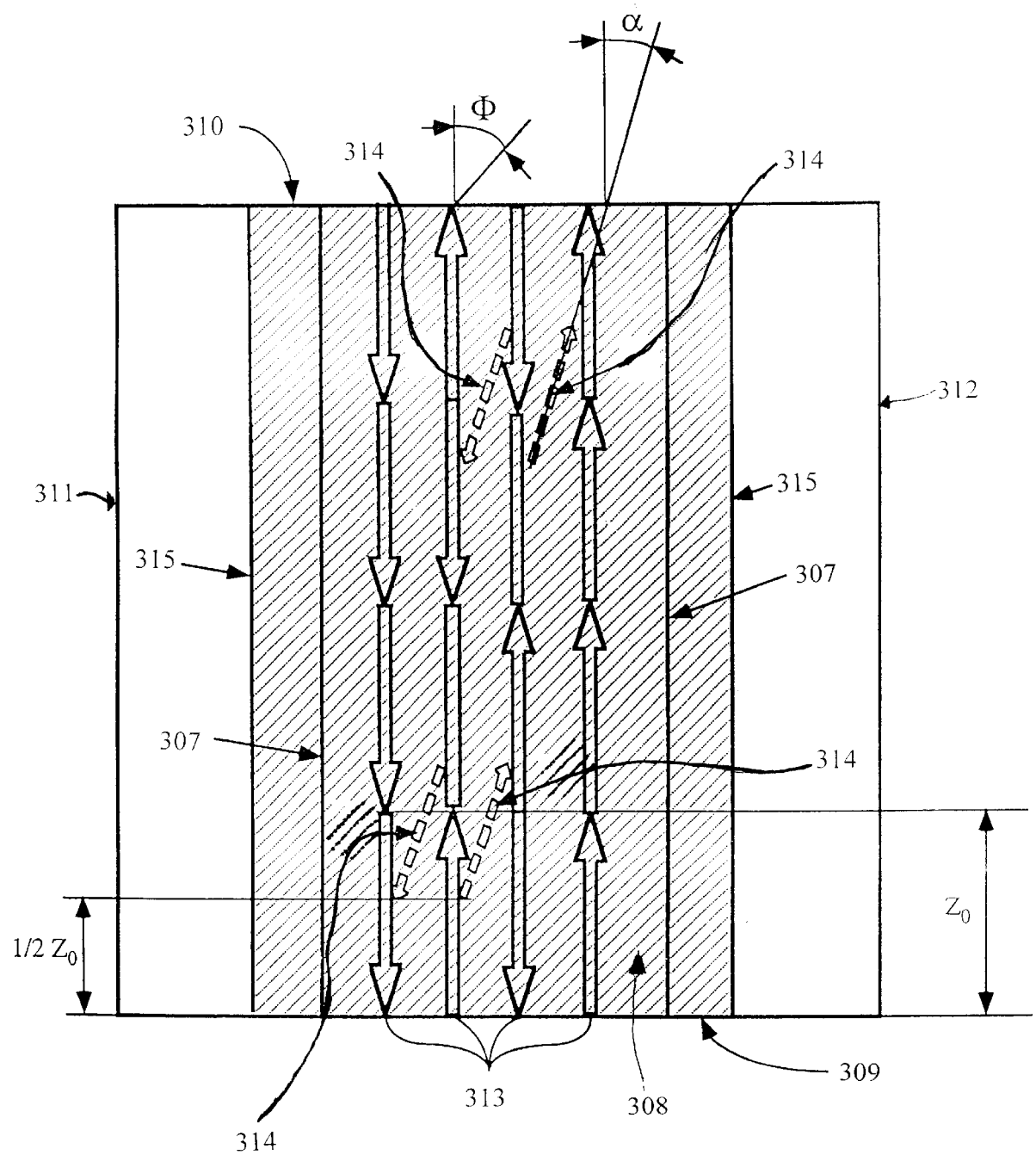
FIG. 3 is a schematic top plan view of the broad area semiconductor laser of the present invention, showing the structural features of the laser projected onto a single plane and including a representation of the light rays in the principal optical mode and in the first-order Bragg diffraction from the grating.

The propagation of light waves inside an embodiment of a broad area semiconductor laser of the present invention is illustrated in FIG. 3. In this embodiment, the distances between electrical contact boundaries 307 and side walls 311 and 312 are large enough to introduce sufficient light absorption in the unpumped region to prevent the formation of a parasitic optical cavity between the walls 311 and 312. Also, it is preferable to use anti-reflection coatings on walls 311 and 312 or to treat these surfaces in some other way to reduce the efficiency of these surfaces for reflection. In the embodiment of FIG. 3, the light in the optical mode defined by the optical cavity is coupled out from either or both reflective ends 309 and 310. The optical axis and thus the direction of propagation for the principal optical mode in the optical resonant cavity is perpendicular to the reflective ends 309 and 310. Generally, it is preferable to use a highly-reflective coating for one end so that essentially all of the laser light is coupled out of the other end.

In the embodiment shown in FIG. 3, a grating area 308 is defined in the lateral direction by boundaries 315, extending beyond the pumped area defined by boundaries 307. The principal optical mode, which has a laterally-homogeneous intensity distribution, is represented in FIG. 3 by light rays 313 which propagate along the optical cavity axis. For simplicity, only a few light rays are shown in FIG. 3, although the principal optical mode actually occupies the entire optical cavity under the pumped area defined by boundaries 307. Although the Bragg resonance conditions are not fulfilled for light rays 313, a small amount of diffraction from these light rays will still occur due to interaction with the grating 308. As a result, a low intensity, first-order diffraction wave will appear, represented in FIG. 3 by light rays 314, which propagate at an angle $\alpha$ with respect to the optical cavity axis. The intensity of the principal optical mode, which can be considered as the zero-order wave, will oscillate with distance as the light propagates along the optical axis between the reflective ends 309 and 310. The period of oscillation $z_0$ is equal to:

$$z_0 = \frac{\lambda}{2n\sqrt{\kappa^2 + \gamma^2}}$$

where $\lambda$ is the wavelength of the excited light waves in vacuum, n is the effective refractive index of the waveguide, $\kappa$ is the dimensionless grating coupling coefficient, and $\gamma$ is the dimensionless Bragg condition detuning value. Preferably, the grating of the present invention provides a relative detuning value $\gamma/\kappa$ of about 0.5 to 5. The two parameters $\kappa$ and $\gamma$ are defined as follows:

$$\kappa = \frac{\delta n \sqrt{\cos\alpha}}{2n}$$

$$\gamma = \frac{\cos\alpha}{2n^2}\left\{\left(\frac{\lambda}{D}\right)^2 \sin^2\left(\frac{\Phi_B - \Phi_0}{2}\right) + n\left(\frac{\lambda}{D}\right)\cos\Phi_B \sin(\Phi_B - \Phi_0)\right\}$$

The parameter $\alpha$ is the angle between the direction of propagation of the principal optical mode and the direction of propagation of the first-order diffracted wave, $\Phi_0$ is the angle between the direction of propagation of the principal optical mode and the grating teeth, and $\delta n$ is the amplitude of the spatial variation in the effective refractive index. The parameter $\Phi_B$ is the Bragg angle, defined as:

$$\sin\Phi_B = \frac{\lambda m_B}{2nD},$$

where $m_B = +1, +2, \ldots$ is the Bragg diffraction order. Preferably, the absolute value of $\Phi_0$ is smaller than $\Phi_B$, and $\Phi_0$, is in the range of approximately 3° to 10°.

The intensity of the principal optical mode has a minimum at a distance $z_0/2$ from the reflective end, as shown in FIG. 3. At this point, the intensity of the principal optical mode has been reduced from its maximum value by a factor of $1/[1+(\kappa/\gamma)^2]$. The laser energy lost from the principal optical mode has at that point been diffracted into the first-order diffractive waves 314, as shown in FIG. 3. However, after propagating an additional distance of $z_0/2$ (a total distance of $z_0$), the intensity in the first-order diffracted wave is reduced to zero and the principal optical mode has been restored to its maximum intensity. This process is repeated after propagating through each additional distance $z_0$ along the optical axis. In this way the principal optical mode, or the zero-order wave, is coupled with the first-order diffractive wave, and they will exchange energy with each other. In this case, in accordance with the present invention, the principal optical mode receives an additional phase shift due to the coupling with the first-order waves. The additional phase shift may be considered as a correction $\delta k$ to the wave vector $k_0$ of the principal optical mode. The value of $\delta k$ is equal to:

$$\delta k = k_0(\sqrt{\kappa^2 + \gamma^2} - \gamma)$$

where $k_0 = 2\pi n/\lambda$.

As indicated above, the value of the dimensionless Bragg condition detuning parameter $\gamma$ depends on the angle $\Phi_0$, which is the angle between the direction of propagation of the principal optical mode and the grating teeth. As a result, $\delta k$ and thus the total wave vector $k = k_0 + \delta k$ will depend on the angle $\Phi_0$.

The oscillation of optical intensity between the principal optical mode and the first-order diffracted wave, as described above, also has an influence on the optical losses of the principal optical mode as a function of wavelength. Consider the case when the distance $\lambda$ between the two reflective ends 309 and 310 is equal to a whole number m times the period $z_0$ of the intensity variations of the principal optical mode operating at a wavelength $\lambda_0$, due to its interaction with the grating 308:

$$\lambda = m z_0$$

where m is an integer and $z_0$ is as defined above. Further assume that the optical intensity in the principal optical mode is at its maximum value as that mode begins its propagation through the active region from reflective end 309. In this case, the intensity in the principal optical mode will also be at its maximum value when the mode reaches reflective end 310, and the maximum amount of optical feedback will be provided to the principal optical mode upon reflection from end 310. If, however, the principal optical mode is operating at a different wavelength $\lambda_1$, such that the distance $\lambda$ between the two reflective ends 309 and 310 is equal to a whole number times the period $z_0$ plus an additional half period $z_0/2$, then the intensity of the principal optical mode will be at a relatively low value when the mode reaches reflective end 310, and the maximum intensity will remain in the first-order diffracted wave. Upon reflection from the end 310, the amount of light returned to this principal optical mode at wavelength $\lambda_1$ will be reduced compared to the amount of light returned in the case of the principal optical mode at wavelength $\lambda_0$. The principal optical mode at wavelength $\lambda_0$ will therefore have the highest optical feedback and thus a lower lasing threshold compared to other modes at wavelengths in the vicinity of $\lambda_0$. For typical parameters of broad area semiconductor lasers, the difference in lasing wavelengths $\Delta\lambda$ between adjacent principal optical modes with maximum optical feedback is approximately 6 to 12 nanometers.

As discussed above, the intensity in the principal optical mode at wavelength $\lambda_1$ will be reduced from its maximum value at the reflective end 310 by a factor of $1/[1+(\kappa/\gamma)^2]$. This loss in intensity can be viewed as an additional effective optical loss imposed on the principal optical mode at wavelength $\lambda_1$. Again for typical parameters for broad area semiconductor lasers, this additional effective loss is in the range of 5 cm$^{-1}$ to 10 cm$^{-1}$. Thus in all embodiments of the present invention, effective optical losses in the resonant cavity are a function of wavelength. Other wavelength-sensitive effects are also present in semiconductor lasers, notably the optical gain as a function of wavelength and the longitudinal mode structure of the resonant optical cavity, both of which are well known in the state of the art. In one embodiment of the present invention, the properties of the semiconductor laser and the angled grating can be selected in such a way that the combined effect of all wavelength-sensitive phenomena is to produce a laser structure that operates in a single longitudinal mode.

In the discussion above, the angled grating is treated as an ideal grating, with no losses due to optical scattering. However, as is well known in the state of the art, a real grating fabricated in a semiconductor laser structure will probably be less than ideal and will cause some optical scattering. For example, this may be due to imperfections in the grating introduced during the fabrication process. As a result, additional optical losses that are independent of wavelength are also present in real devices. In this real case, the light intensity transferred from the principal optical mode due to interaction with the grating does not all appear in the first-order diffracted wave; instead, some portion of the light is irretrievably lost due to optical scattering by the grating. In the preferred embodiment of the present invention, this optical loss is reduced by choosing the semiconductor laser and angled grating parameters such that the detuning parameter $\gamma$ is relatively large (for example, $\gamma/\kappa > 0.5$).

Figure 4:
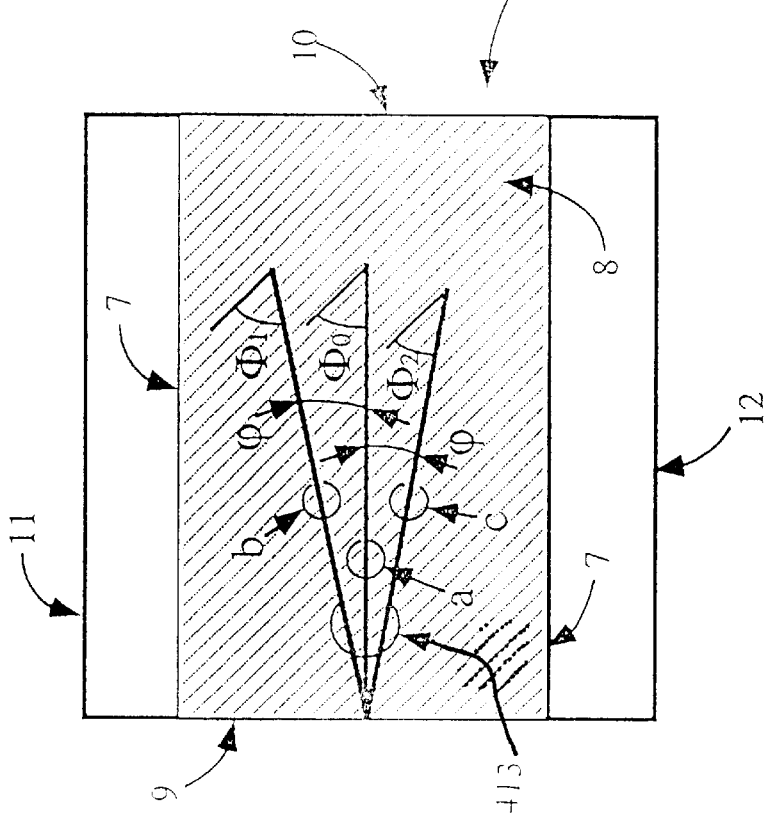
FIG. 4 is a schematic top plan view of the broad area semiconductor laser of FIG. 1, showing the structural features of the laser projected onto a single plane and including a representation of the light rays in the principal optical mode, which propagates along the optical cavity axis, and the perturbing laser modes, which propagate at an angle with respect to the optical cavity axis.

FIG. 4 illustrates the perturbing waves in the semiconductor laser or amplifier of FIGS. 1 and 2. Each of the perturbing waves propagates at an angle with respect to the optical axis, in addition to the principal optical mode that propagates along the optical axis. The overall optical field is thus represented by waves 413 in FIG. 4, which includes three rays a, b, and c. The component corresponding to the principal optical mode, which produces the unperturbed homogeneous intensity distribution in the lateral direction, is represented by ray a. Rays b and c represent perturbing waves. The effect of the perturbing waves is to modify the lateral intensity distribution to produce periodic intensity variations or filaments. For example, consider a periodic lateral intensity variation that has a period d. In this case, the lateral component of the wave vector q of the perturbing waves will be given by $q = 2\pi/d$. As represented in FIG. 4, the perturbing rays b and c propagate at an angle of $\pm\phi$ with respect to ray a. The angle $\phi$ satisfies the relationship $$\sin\phi = q/k$$

As also shown in FIG. 4, rays a, b, and c have different angles $\Phi_0$, $\Phi_1$, and $\Phi_2$ respectively between each ray and the grating teeth. From this geometry, it is apparent that $$\Phi_1 = \Phi_0 + \phi,$$

and $$\Phi_2 = \Phi_0 - \phi.$$

As indicated above in the description of FIG. 3, the interaction of a wave with the grating produces a phase shift in the wave, with the magnitude of the phase shift depending on the angle between the wave propagation direction and the grating teeth. Because this angle changes as the wave propagation direction changes, this effect introduces a lateral optical anisotropy in the laser waveguide. This optical anisotropy leads to differences in the length of the wave vectors k, $k_1$, and $k_2$ for all three waves represented in FIG. 4 by rays a, b, and c, respectively. The tendency of perturbing waves to grow in intensity is due to the nonlinear interactions within the active region, and the degree of growth of the perturbing waves defines the stability condition for the preservation of a laterally homogeneous intensity distribution and the suppression of filamentation. The degree of growth depends on the phase matching conditions between the interacting waves.

Figure 5:
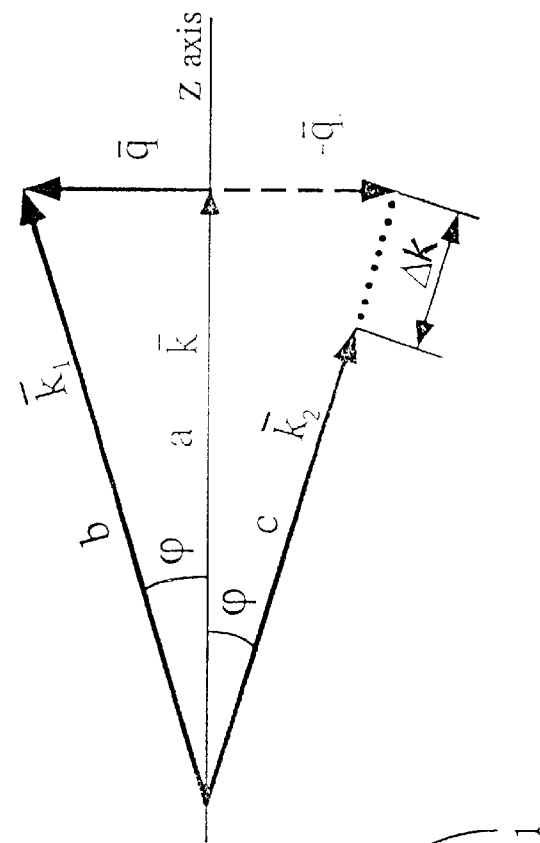
FIG. 5 is a wave vector diagram for the interaction of the perturbing waves with an angled grating of the present invention.

A useful way to illustrate the phase matching condition for the interacting waves is through the use of wave vector diagrams. In FIG. 5, a wave vector diagram for the interacting waves, represented by rays a, b, and c, is shown in accord with the present invention. The phase mismatch, given by $\delta k$, depends of the angle $\phi$ and the length of wave vectors k, $k_1$, and $k_2$. For efficient suppression of intensity filamentation in the lateral direction, in all embodiments of the present invention, it is preferable to choose the grating parameters and thus the value of $\gamma$ (the dimensionless Bragg condition detuning parameter) to maximize the value of $\gamma k$ at each angle $\phi$ or, correspondingly, at the lateral period d of the intensity variations due to the perturbing waves. The value of $\Delta k$ is given by:

$$\Delta k = |k_1| + |k_2| - 2|k|.$$

Figure 6:
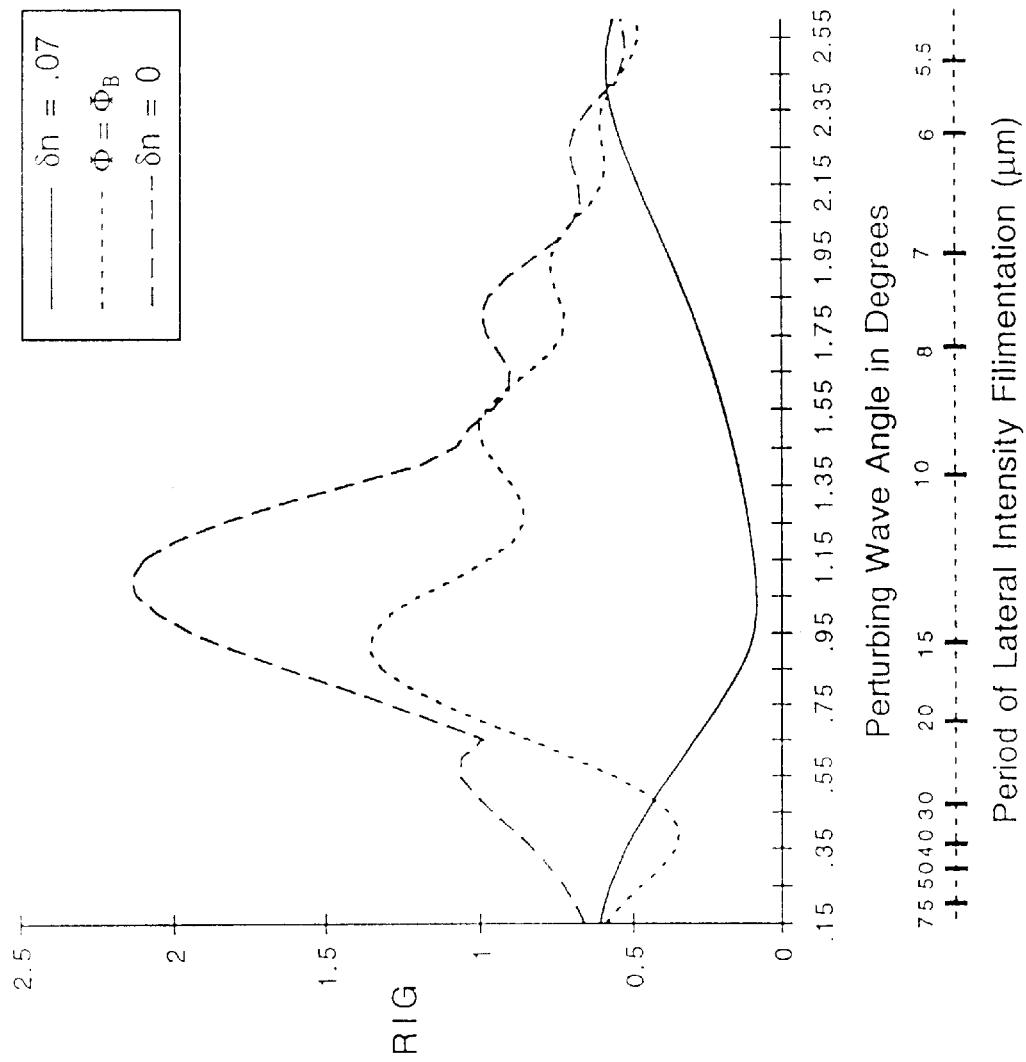
FIG. 6 is a graph of the Relative Intensity Growth (RIG) for the perturbing waves as a function of the angle $\phi$ between the optical cavity axis and the direction of propagation of the perturbing wave (top horizontal scale) or, alternatively, as a function of the lateral periodic spacing for intensity filamentation (bottom horizontal scale) calculated for the broad area semiconductor laser of FIGS. 1 and 2.

The effectiveness of this approach is illustrated in FIG. 6, which gives the calculated Relative Intensity Growth (RIG) for the perturbing waves as a function of either the perturbing wave angle $\phi$ or the period d for lateral intensity fluctuations. The incremental growth is normalized to the value corresponding to the threshold for intensity filamentation; that is, the value of RIG=1 responds to the threshold for intensity filamentation. FIG. 6 shows three curves calculated for typical parameters for broad area semiconductor lasers, for a pumping level of two times lasing threshold. The differences between the three curves are due solely to changes in the grating parameters. First, the curve labeled $\delta n=0.07$ (solid curve) is calculated for grating parameters which are optimized to minimize the Relative Intensity Growth of the perturbing waves, and represents a ratio of the detuning parameter $\gamma$ to the coupling parameter $\kappa$ of $\gamma/\kappa = 0.86$. The curve labeled $\Phi = \Phi_B$ (dotted curve) is calculated for the same grating parameters as those chosen for the solid curve, except that the grating angle $\Phi$ is chosen such that the detuning parameter $\gamma=0$; that is, such that the Bragg resonance conditions are met. The curve labeled $\delta n=0$ (dashed curve) is calculated for the laser without any grating.

As indicated above, at any point for which the RIG value exceeds 1.0, amplification of the associated perturbing wave is expected and filamentation will result. For the dashed curve in FIG. 6 which represents a conventional broad area semiconductor laser, the RIG value exceeds 1.0 for filamentation periods ranging from about 9 to 30 $\mu$m. In this case, the lateral intensity distribution is expected to be a complicated picture of lateral intensity modulation. For a laser with a grating which operates at the Bragg resonance condition, as shown by the dotted line, intensity filamentation will appear as well, but lateral intensity modulation will contain a smaller number of spatial harmonics than in the previous case, with filamentation periodicity ranging from about 12 to 16 $\mu$m. Finally, a laser with a preferred grating according to the present invention, as shown by the solid line, will be free of intensity filamentation because the RIG value is less than 1.0 for all periodicity values for filamentation.

In the embodiment presented in FIG. 2, the grating 8 exactly covers the entire pumped active region 6 between the electrical contact boundaries 7. FIG. 3 shows another embodiment in which grating 308 has boundaries 315 such that the grating area is larger than the pumped active region area, which is restricted by the electrical contact boundaries 307. Other alternate configurations of the grating and pumped areas, in accord with the present invention, are also possible as shown in FIGS. 7, 8, and 9.

Figure 7:
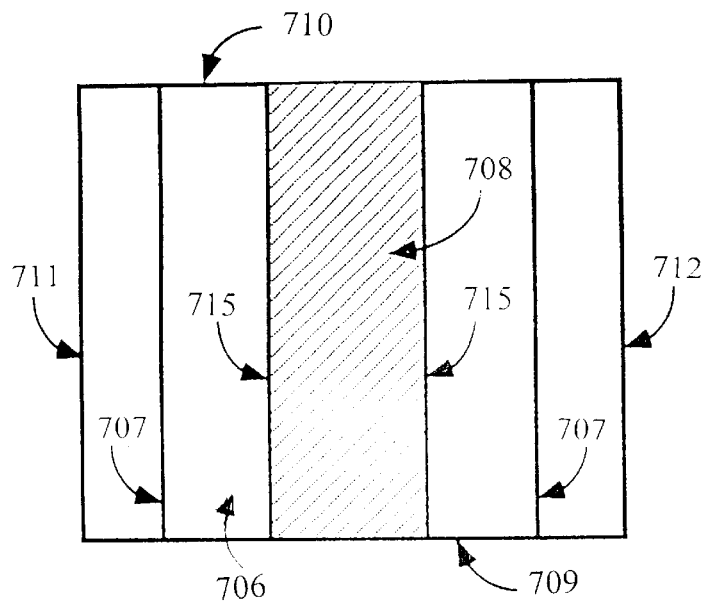
FIG. 7 is a schematic top plan view of a broad area semiconductor laser of the present invention, showing the structural features of the laser projected onto a single plane, with a grating region overlapping only partially with the active region.

FIG. 7 shows a semiconductor laser or amplifier that includes reflective ends 709 and 710 and side boundaries 711 and 712. A grating 708 having boundaries 715 occupies only part of a pumped active area 706 that is restricted by boundaries 707. In this configuration, the lateral parts of the active region between boundaries 715 and 707 amplify the light propagating along the grating boundaries 715 in order to smooth the intensity distribution near the lateral edges of the output optical beam.

Figure 8:
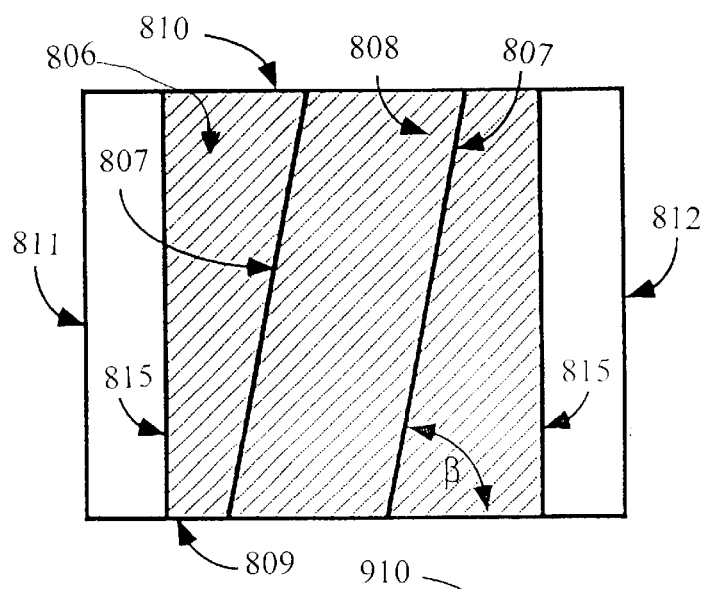
FIG. 8 is a schematic top plan view of a broad area semiconductor laser of the present invention, showing the structural features of the laser projected onto a single plane, with the pumped active region inclined at an angle with respect to the resonator axis of the optical cavity.

FIG. 8 shows a semiconductor laser or amplifier that includes reflective ends 809 and 810 and side boundaries 811 and 812. In the configuration of FIG. 8, a pumped active region 806, restricted by boundaries 807, is tilted with respect to the reflective ends 809 and 810 of the laser cavity at an angle $\beta$. A grating 808, as laterally defined by the boundaries 815, extends laterally beyond the area of the pumped active region. In accord with the present invention, the parameters of grating 808 are chosen such that the principal light waves propagating from one reflective end 809 of the laser cavity to the other reflective end 810 are not in a Bragg resonance condition. Similar to the situation outlined in the description of the embodiment of FIG. 3, the principal light waves interact slightly with the grating 808, and a small proportion of the optical intensity in the principal light wave is diffracted into the first diffraction order, which propagates at an angle β with respect to the normal to the reflective ends 809 and 810 of the laser cavity. Also similar to the situation outlined in the description of the embodiment of FIG. 3, a portion of the light intensity thus oscillates between the principal light wave (zero-order beam) and the first-order diffracted wave as the light propagates along the optical axis between the reflective ends 809 and 810. As a result of this transformation, the center of the optical beam is displaced laterally as the beam propagates, so that the center of the optical beam traces an optical path that is slightly tilted with respect to the optical axis. By choosing the correct angle β between π/2 and π/2−α, the pumped active region can be more closely matched to the actual propagation direction of the center of the optical beam, and a lower threshold current density and higher slope efficiency for the semiconductor laser can be obtained.

Figure 9:
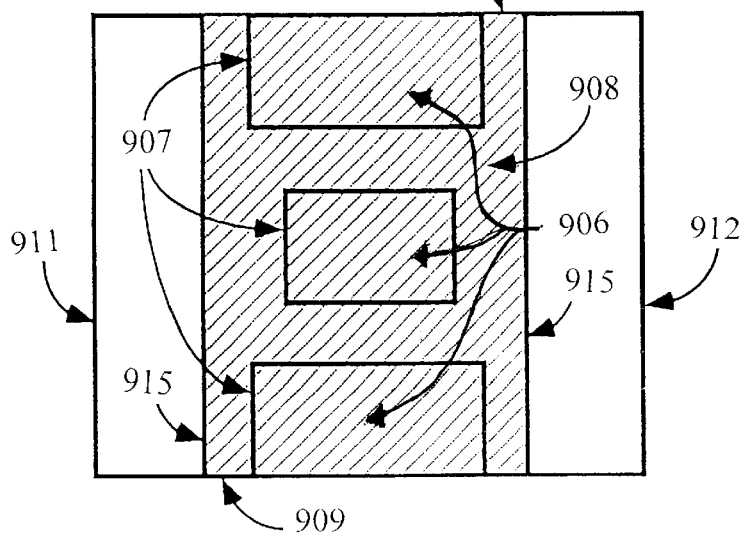
FIG. 9 is a schematic top plan view of a broad area semiconductor laser of the present invention, showing the structural features of the laser projected onto a single plane, with a segmented contact that matches the nonuniform intensity of the optical mode in a laser with strongly asymmetric end reflectivities.

FIG. 9 shows another embodiment of the present invention, in which a semiconductor laser which includes reflective ends 909 and 910, side boundaries 911 and 912, and a grating 908, also includes a laser cavity laterally defined by boundaries 915 and containing three separately pumped active regions 906, restricted by boundaries 907. Additionally, one reflective end of the laser cavity, for illustrative purposes the reflective end 910, has a relatively low reflectivity in order to extract most of the laser energy in a single direction. Reflective end 909 thus has a high reflectivity and reflective end 10 has a low reflectivity. Because of the differences in reflectivity, the optical intensity along the optical axis is significantly nonuniform. The intensity is lowest near the high reflectivity end 909 and increases to a maximum near the low reflectivity end 910. By using separate pump contacts for the areas near the end 909, in the center, and near the end 910, it is possible to match the spatial distribution of pumping density to the optical field intensity within the laser cavity. As a result, it is possible to obtain more stable laser operation and a higher slope efficiency for the optical output. Other alternate configurations, containing other numbers or shapes of the pumped active regions, are also possible. Additionally, it also possible to vary the lasing wavelength by changing the pumping in the separate pumped active regions to modify the refractive index along the laser axis.

Figure 10:
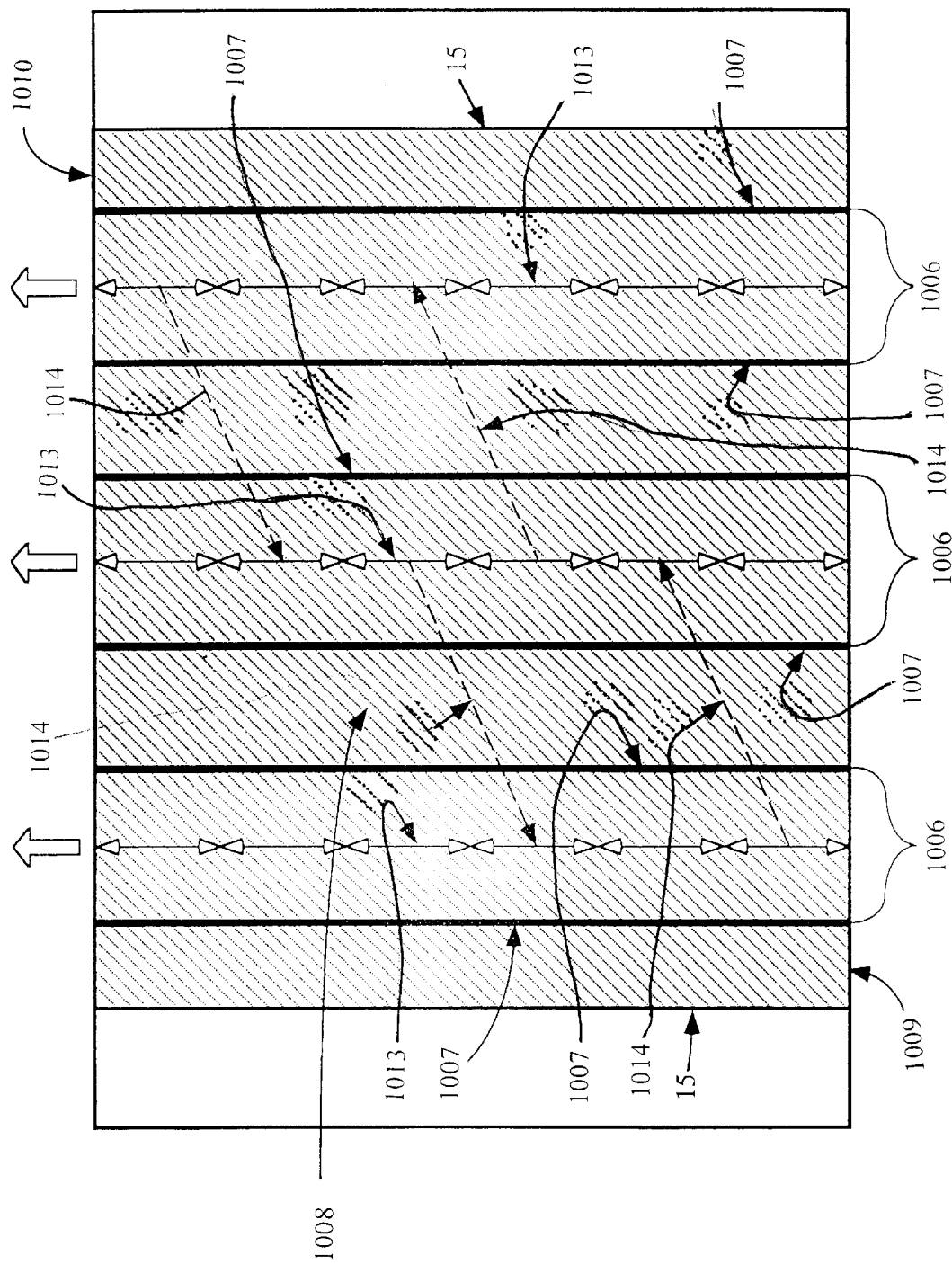
FIG. 10 is a schematic top plan view of a monolithic array of broad area semiconductor lasers of the present invention, showing the structural features of the laser projected onto a single plane with each laser having a grating-induced optically anisotropic waveguide, where coupling between lasers is accomplished by low-intensity Bragg reflections from the grating.

The configuration shown in FIG. 10 represents a monolithically coupled laser array having a grating 1008, the reflective ends 1009 and 1010, and principal optical modes 1013. For illustrative purposes, this figure shows three pumped active regions 1006, through which light waves 1013 travel. However, it should be noted that in some embodiments, the array of the present invention can have a different number of pumped active region. The active regions are restricted by boundaries 1007. The three pumped regions are divided from each other by unpumped passive regions. The optical coupling between nearest pumped regions is accomplished by using the first-order diffractive waves 1014, which are always present similar to the situation outlined in the description of the embodiment of FIG. 3. By varying the widths of the active regions and the passive regions in between, it is possible to optimize the coupling between the pumped active regions and prevent parasitic amplification of light in the lateral direction. Alternate configurations, with different numbers of elements in the array, are also possible.

Figure 11:
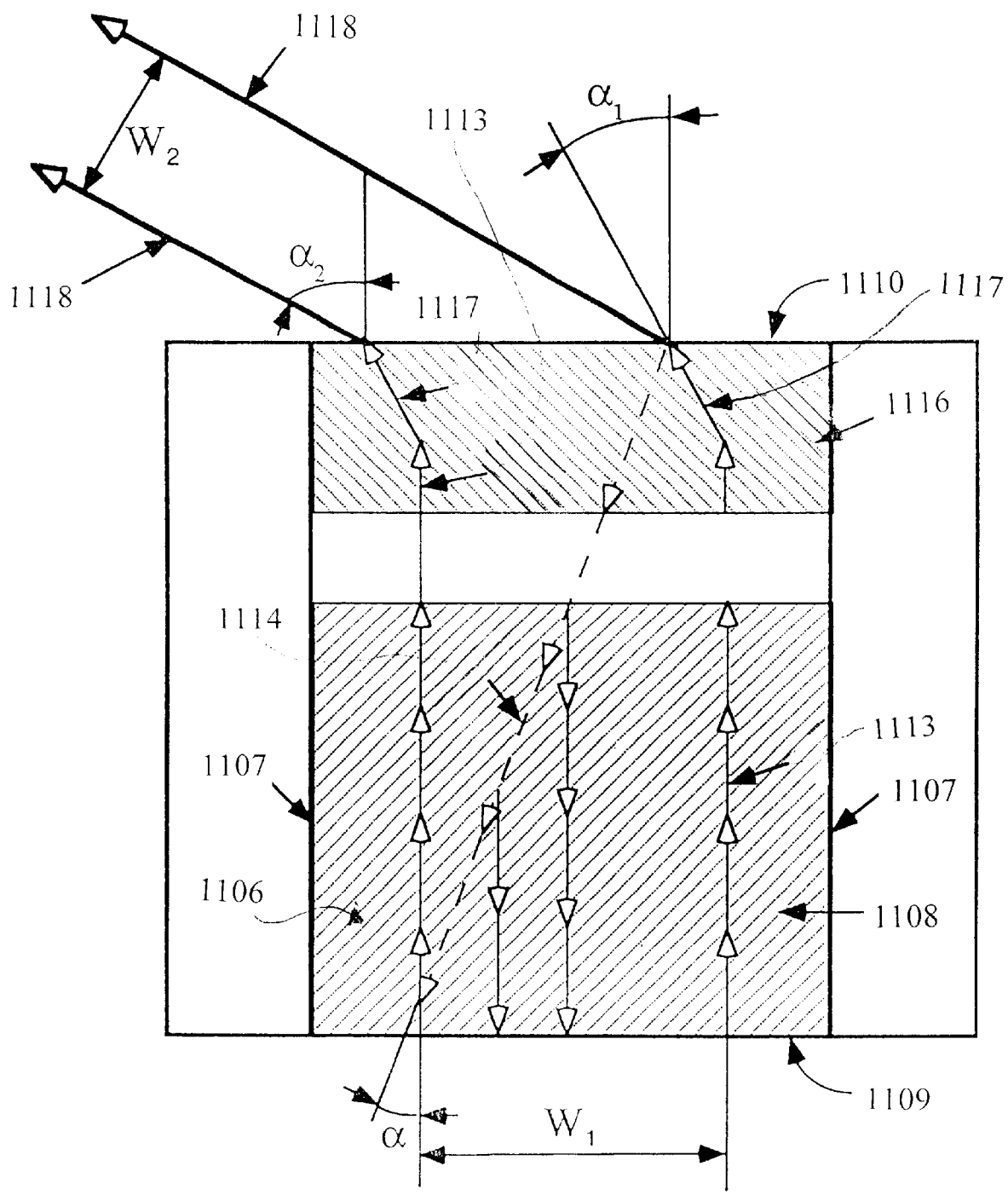
FIG. 11 is a schematic top plan view of a broad area semiconductor laser of the present invention, showing the structural features of the laser projected onto a single plane, combining a grating-induced optically anisotropic waveguide of the present invention with an additional grating at Bragg resonance conditions for deflection of the light waves generated by the active region.

FIG. 11 shows another embodiment of the present invention, including a pumped active region 1106 defined by boundaries 1107, in which an additional grating 1116, referred to as a reflector grating, is introduced into the optical cavity. Grating 1108, which occupies only part of the optical cavity, has parameters selected to discriminate against lateral filamentation in accord with the present invention as outlined in the descriptions of FIG. 2 and FIG. 3. Principal light waves 1113 that make the round trip through the laser cavity propagate through an additional reflector grating 1116. The parameters of the reflector grating 1116 are selected so as to deflect efficiently the principal light waves 1113 into the first diffractive order of the grating at an angle $\alpha_1$, to form deflected waves 1117. These deflected waves 1117 are incident on the reflective cavity end 1110 at the angle $\alpha_1$ with respect to the normal to end 1110. The light which is reflected at the end 1110 is tilted by an additional angle $\alpha_1$ and passes back through the reflector grating 1116 without further diffraction as a zero order wave. By choosing the parameters of the reflector grating 1116 properly, the angle of propagation of this reflected wave can be made to match the angle of propagation α of the first-order diffracted waves 1114 in grating 1108. In this way, light is coupled back into the principal optical mode represented by principal light waves 1113, providing optical feedback for the laser.

Output waves 1118 of FIG. 11 propagate at an angle $\alpha_2$ with respect to the normal to end 1110. As a result, the width $W_2$ of the output optical beam is smaller than the width $W_1$ of the optical beam in the laser cavity. This has one advantage that the aspect ratio of the output beam (the ratio of the lateral beam width $W_2$ compared to the transverse beam width) is reduced, which simplifies the collimation of the output beam by using external optical elements. By varying the parameters of the grating 1118 and the reflector grating 1116, it is possible to choose the angle $\alpha_2$ to produce the desired width $W_2$ of the output optical beam. Additionally, it is also possible to change the reflectivity coefficient of end 1110 by a corresponding change in the angle $\alpha_1$. In particular, if $\alpha_1$ is near the Brewster angle, it is possible to obtain a very small reflectivity coefficient for end 1110.

The illustration of FIG. 11 shows the reflective ends 1109 and 1110 of the laser cavity parallel to each other. In this case, the angle $\alpha_1$ preferably is equal to the angle α in order to provide optical feedback for the laser. However, in the general case, the reflective ends 1109 and 1110 need not be parallel, and angle $\alpha_1$ will differ from angle α in order to provide optical feedback. Further, by using a reflector grating 1116 that has a varying spatial period, it is also possible to introduce focus or defocus in the output beam 1118. Finally, it is also possible to design the reflector grating 1116 so that the diffracted light is emitted vertically with respect to the laser structure (in the transverse direction), creating what is known in the state of the art as a surface-emitting laser.

Figure 12:
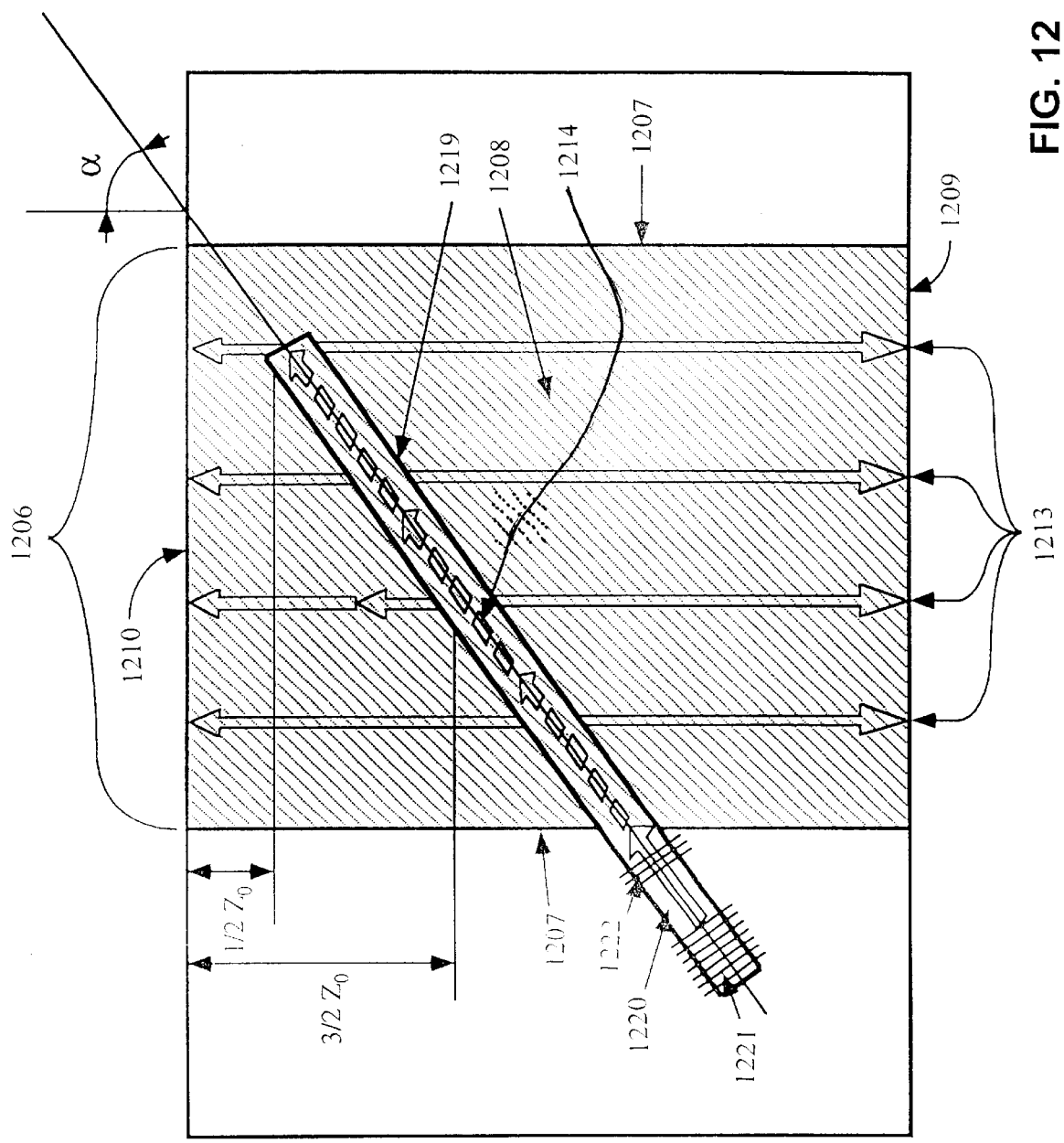
FIG. 12 is a schematic top plan view of a master oscillator-power amplifier (MOPA) configuration of the present invention, showing the structural features of the amplifier projected onto a single plane, with the grating-induced optically anisotropic waveguide section acting as power amplifier.

FIG. 12 illustrates another embodiment of the present invention, in which a master oscillator and power amplifier are integrated on a monolithic substrate. The master oscillator is a laser structure 1220, which includes a separate electrical contact (not shown) for pumping an active region (not shown) and has reflectors 1221 and 1222 which are designed to reflect a portion of the incident light to produce the resonant optical cavity for the laser. This laser may be also a DFB or DBR laser structure, in which case the reflectors 1221 and 1222 are gratings; a DBR structure is illustrated schematically in FIG. 12. The laser structure 1220 is confined in the lateral direction by a waveguide 1219. The power amplifier is the structure including a pumped region 1206, restricted by boundaries 1207 in the lateral direction and by ends 1209 and 1210, and including a grating 1208. The optical waveguide 1219 for the master oscillator 1220 is extended beyond the reflector 1222 to transfer optical energy to the power amplifier as follows: The optical waveguide extends over the width of the pumped region 1206 and is oriented at an angle α with respect to the optical axis of the amplifier, so that a wave propagating along waveguide 1219 is at the angle for the first-order diffracted wave 1214 of grating 1208 in the power amplifier. Due to the detuning from Bragg resonance condition in accord with the present invention, optical coupling from waveguide 1219 into principal light waves 1213 occurs rather slowly along the length of waveguide 1219, so that the optical coupling is essentially uniform over the total lateral cross-section of the power amplifier. The transfer of optical energy from the first-order diffracted waves 1214 to the principal light waves 1213, similar to what is explained in the description of the embodiment of FIG. 3, establishes each of the principal light waves 1213, each of which is amplified by the active region and then exits the amplifier structure through the ends 1209 or 1210. The presence of grating further acts to suppress the formation of filamentation in the power amplifier, in the same manner as described above for FIGS. 1, 2, 4, 5, and 6. The reflectivities of ends 1209 and 1210 are preferably chosen such that the pumped active region 1206 does not achieve lasing threshold independent of optical coupling from waveguide 1219. One end may have a high reflectivity and the other end a very low reflectivity in order to direct most of the laser output power in a single direction.

Figure 13:
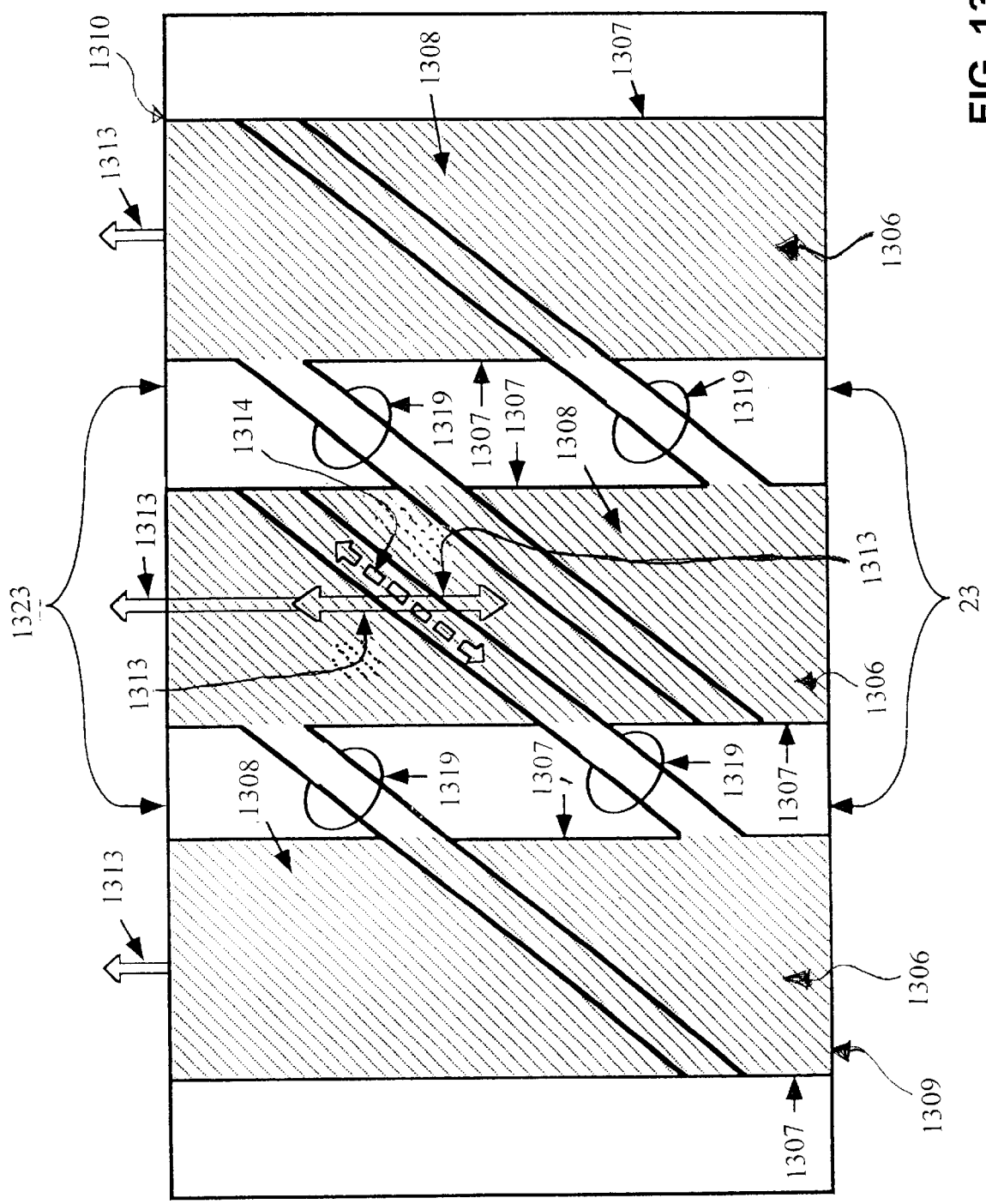
FIG. 13 is a schematic top plan view of a monolithic array of broad area semiconductor lasers of the present invention, showing the structural features of the amplifier projected onto a single plane, with each laser having a grating-induced optically anisotropic waveguide, coupling between lasers accomplished by low-intensity Bragg reflections from the grating, and additional coupling between adjacent lasers by means of an optical waveguide.

FIG. 13 illustrates another embodiment of the present invention, which is an alternate version of a monolithic laser array including reflective ends 1309 and 1310. The embodiment illustrated in FIG. 13 includes three independent lasers with pumped active regions 1306 defined by boundaries 1307 and separated by unpumped regions 1323. A grating 1308 extends over the pumped active regions 1306, but not over the unpumped regions 1323. Nearest lasers are optically coupled to each other by an optical waveguide 1319, having an axis parallel to the direction of propagation of the first-order diffracted waves 1314 in each laser structure. Due to the detuning from Bragg resonance condition in accord with the present invention, optical coupling from waveguide 1319 into the principal light waves 1313 occurs rather slowly along the length of waveguide 1319, so that the optical coupling is essentially uniform over the total lateral cross-section of the adjacent laser. The parts of coupling waveguides 1319 situated in the unpumped areas 1323 may be separately pumped to adjust the optical coupling between the elements of the array. Alternate configurations, with different numbers of elements in the array, are also possible.

Thus, the present invention provides a broad area semiconductor laser or amplifier that is able to generate a coherent single spatial mode beam without producing intensity filamentation in the lateral direction. The present invention further provides a broad area semiconductor laser that can be used in laser arrays or in a master oscillator power amplifier (MOPA) to produce a coherent output beam for use in high power applications.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:
1. A coherent light-generating semiconductor structure comprising:
   at least one first active region including a first pumped portion for achieving optical gain, said first pumped portion having an optical gain bandwidth;
   a first optical waveguide for confining light waves in the transverse direction and for propagating light waves along the optical axis of said first optical waveguide;
   first and second reflective means, said first and second reflective means being spaced apart from one another and defining a first resonant optical cavity therebetween, said first pumped portion of said at least one first active region being located at least partially within said first resonant optical cavity, and said first resonant optical cavity encompassing at least a portion of said first optical waveguide;
   said first active region, said first optical waveguide, and said first resonant optical cavity having properties necessary to establish and maintain a first principal optical mode;
   a first grating located in at least a portion of said first resonant optical cavity, said first grating having first grating teeth oriented at an angle relative to said first and second reflective means, such that substantially all excited light waves which are incident on said first and second reflective means and which have a wavelength within said optical gain bandwidth are out of Bragg resonance with said first grating.

2. The semiconductor structure of claim 1, wherein said first grating teeth are oriented at an angle relative to said first and second reflective means such that said grating teeth produce a phase shift of at least 2π in substantially all excited light waves that propagate through said first optical waveguide.

3. The semiconductor structure of claim 1, wherein said first grating produces a modulation of the effective refractive index of said first optical waveguide such that the relative detuning from the Bragg condition, characterized by the ratio of the relative detuning value to the grating coupling coefficient, is in the range of approximately 0.5 to 5.

4. The semiconductor structure of claim 1, wherein said first grating causes intensity variations in light waves which interact with said first grating and the distance between said first and second reflective means is equal to an integer multiple of the period of said intensity variations of said light waves.

5. The semiconductor structure of claim 1, further comprising a first excitation means for pumping said first pumped portion of said first active region.

6. The semiconductor structure of claim 5, wherein said first active region is segmented into at least two independently controlled sections, each of said sections having a location and a degree of excitation that can be substantially matched to the optical intensity distribution of said first principal optical mode inside said first resonant optical cavity.

7. The semiconductor structure of claim 1, further comprising a deflection means for deflecting, focusing, and defocusing of said propagated light waves in a lateral direction, said deflection means being optically coupled to at least a portion of said first active region.

8. The semiconductor structure of claim 7, wherein said deflection means comprises a reflector grating operating within the Bragg resonance bandwidth at the wavelengths of said propagated light waves.

9. The semiconductor structure of claim 1, further comprising a surface emission means for causing the surface emission of said propagated light waves, said surface emission means being optically coupled to at least a portion of said first active region.

10. The semiconductor structure of claim 9, wherein said surface emission means comprises a second order DBR grating.

11. The semiconductor structure of claim 1, wherein said first and second-reflective means are parallel to each other.

12. The semiconductor structure of claim 1, wherein said first and second reflective means are oriented at an angle relative to each other.

13. The semiconductor structure of claim 1, wherein said semiconductor structure comprises a linear array of semiconductor lasers, each of said lasers having a pumped portion separated from at least one neighboring pumped portion by a passive region.

14. The semiconductor laser array of claim 13, further comprising at least one coupling waveguide for controlling optical coupling between individual semiconductor lasers in said linear array.

15. The semiconductor laser array of claim 14, wherein said coupling waveguide, connecting said adjacent semiconductor lasers in said linear array is positioned at the angle for first-order Bragg diffraction from a laser principal optical mode in each of said semiconductor lasers.

16. The semiconductor structure of claim 1, wherein said semiconductor structure further comprises:

an external optical input; and first pumping means for producing an optical gain in said first active region, said first active region, said first optical waveguide, said first and second reflective means, said first resonant optical cavity, said first grating, and said first pumping means together comprising a semiconductor amplifier structure for receiving said external optical input.

17. The semiconductor structure of claim 16, wherein said external optical input is provided by a semiconductor laser.

18. The semiconductor structure of claim 17, wherein said semiconductor amplifier structure is laterally disposed relative to said optical resonant cavity axis.

19. The semiconductor structure of claim 17, wherein said first pumping means of said semiconductor amplifier is provided independently of pumping means used to pump said master semiconductor laser, in order to allow for independently tuning the wavelength of light waves generated by said semiconductor laser and for independently adjusting the gain level in said semiconductor amplifier structure.

20. The semiconductor structure of claim 19, wherein said semiconductor laser and said semiconductor amplifier structure are located on different substrates and are optically coupled together.

21. The semiconductor structure of claim 16, wherein said semiconductor laser is located on the same substrate as said semiconductor amplifier structure, thereby forming a monolithically integrated structure.

22. The semiconductor structure of claim 21, wherein said laser and said semiconductor amplifier are optically coupled such that the angle between the laser axing and said first grating teeth is the angle for first-order Bragg diffraction from said amplifier principal optical mode.

23. The semiconductor structure of claim 1, wherein said first optical waveguide comprises a leaky-wave waveguide, and said first grating is situated on at least one outer layer of said semiconductor structure so that said semiconductor structure forms a surface-emitting laser.

24. The semiconductor structure of claim 1, wherein said first grating is situated on at least one outer layer of said semiconductor structure so that said semiconductor structure forms a surface-emitting laser.

25. A method for reducing filamentation in a high-power laser or amplifier comprising the steps of:

generating a laser beam; and transmitting said laser beam through a resonant optical cavity defined by two reflective means spaced apart from one another and having a grating located therein, said grating having grating teeth oriented at an angle relative to said first and second reflective means such that substantially all generated light waves that become incident on the reflective means are out of Bragg resonance with the grating.

* * * * *